US012724102B2

(12) United States Patent
Harms et al.

(10) Patent No.: US 12,724,102 B2
(45) Date of Patent: Sep. 1, 2026

(54) TEST AND/OR MEASUREMENT SYSTEM AND METHOD FOR CALIBRATING A TEST AND/OR MEASUREMENT SYSTEM

(71) Applicant: Rohde & Schwarz GmbH & Co. KG, Munich (DE)

(72) Inventors: Julian Harms, Munich (DE); Maximilian Friesinger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 194 days.

(21) Appl. No.: 18/668,790

(22) Filed: May 20, 2024

(65) Prior Publication Data

US 2025/0052846 A1 Feb. 13, 2025

(30) Foreign Application Priority Data

Aug. 9, 2023 (EP) .................................... 23190504

(51) Int. Cl.
*G01R 35/00* (2006.01)
*G01R 27/28* (2006.01)

(52) U.S. Cl.
CPC ........... *G01R 35/005* (2013.01); *G01R 27/28* (2013.01)

(58) Field of Classification Search
CPC ....... G01R 35/005; G01R 27/28; G01R 27/32
See application file for complete search history.

(56) References Cited

U.S. PATENT DOCUMENTS 5,467,021 A 11/1995 Adamian et al.
6,639,393 B2 10/2003 Tasker et al.
9,541,592 B1 1/2017 Tsironis
10,429,426 B1 10/2019 Tsironis
2011/0304318 A1* 12/2011 Noujeim ........... G01R 31/2841 324/76.24
2014/0107638 A1* 4/2014 Hancock ................ A61B 18/18 606/33
2019/0017940 A1* 1/2019 Ziegler .................. G01N 21/93
(Continued)

OTHER PUBLICATIONS

Teeter, Douglas A. et al.; "Error Correction and Power Calibration of Active Load Pull Measurement Systems"; IEEE Xplore; 37th ARFTG Conference Digest; 1991; Boston, MA, USA; doi: 10.1109/ARFTG.1991.324023; pp. 86-93.
(Continued)

*Primary Examiner* — Alvaro E Fortich
(74) *Attorney, Agent, or Firm* — Studebaker Brackett PLLC

(57) ABSTRACT

The application includes a test and/or measurement system having an RF signal source to generate an RF stimulus signal; a device port; a signal path connecting the RF signal source to the device port; a measurement unit coupled to the signal path to measure the RF stimulus signal propagating via the signal path to the device port and a measurement signal received at the device port. A bias tee couples to the signal path and includes a DC input port to receive a DC bias signal. The bias tee couples the DC bias signal into the signal path. The system operates in a calibration mode where at least four different calibration standards are alternately connected to the device port. The system couples the DC bias signal into the signal path during the connection of one or more of the calibration standard(s), but not with all of the calibration standards.

20 Claims, 3 Drawing Sheets

(56) References Cited

U.S. PATENT DOCUMENTS

| | | | | |
|---|---|---|---|---|
| 2020/0103485 | A1* | 4/2020 | Anderson | G01R 35/00 |
| 2021/0006331 | A1* | 1/2021 | Chen | H04B 10/54 |

OTHER PUBLICATIONS

Sasse, Guido T. et al.; "Methodology for performing RF reliability experiments on a generic test structure"; 2007 IEEE International Conference on Microelectonic Test Structures; Mar. 19-22, 2007; Tokyo, Japan; doi: 10.1109/ICMTS.2007.374478; pp. 177-182.

Gibiino, Gian Piero et al.; "Multitone Multiharmonic Scattering Parameters for the Characterization of Nonlinear Networks"; IEEE Transactions on Instrumentation and Measurement; vol. 70; Oct. 15, 2020; doi: 10.1109/TIM.2020.3031165; pp. 1-12.

Rzeszut, Piotr et al.; "Towards mutual synchronization of serially connected Spin Torque Oscillators based on magnetic tunnel junctions"; Cornell University Library; arXiv:2306.11608v1 [physics.app-ph]; Jun. 20, 2023; pp. 1-7.

IEC 62024-3 ED1; "High frequency inductive components—Electrical characteristics and measuring methods—Part 3: AC loss measured by sinusoidal wave of inductors for DC-to-DC converters"; 51/1449/CD; IEC; Jun. 30, 2023; Retrieved from the Internet: URL: https://api.iec.ch/harmonized/documents/download/3301350; pp. 1-16.

Vanaverbeke, F. et al.; "A Load-Pull Wafer-Mapper"; 2008 IEEE MTT-S International Microwave Symposium Digest; IEEE Xplore; Jun. 15, 2008; pp. 113-119.

Extended European Search Report issued in EP 23190504.3-1001 by the European Patent Office on Feb. 9, 2024.

* cited by examiner

TEST AND/OR MEASUREMENT SYSTEM AND METHOD FOR CALIBRATING A TEST AND/OR MEASUREMENT SYSTEM

TECHNICAL FIELD OF THE INVENTION

The invention relates to a test and/or measurement system, such as a vector network analyzer (VNA), and to a method for calibrating a test and/or measurement system.

BACKGROUND OF THE INVENTION

A vector network analyzer (VNA) is a device for measuring the RF performance of a radio frequency device-under-test (DUT). The VNA can be used to characterize scattering parameters (S-parameters) of the DUT.

Periodic calibration of the VNA setup is crucial to achieve accurate and repeatable VNA measurements. To calibrate the VNA, a calibration routine is typically carried out during which different calibration standards are connected to the VNA.

When characterizing some DUTs (e.g., amplifiers) with a VNA, a DC voltage is applied to the DUT (so-called biasing). However, such a DC voltage is typically not applied during calibration, since most calibration standards cannot suspend much dissipation power. Thus, unwanted effects which stem from the DC signal, e.g. parasitic effects, are not taken into account during calibration and are therefore not compensated by the calibrated VNA during a measurement. This can lead to measurement inaccuracies.

SUMMARY OF THE INVENTION

Thus, it is an objective to provide an improved test and/or measurement system and an improved method for calibrating a test and/or measurement system, which avoid the above-mentioned disadvantages.

The object of the present invention is achieved by the solution provided in the enclosed independent claims. Advantageous implementations of the present invention are further defined in the dependent claims.

According to a first aspect, the invention relates to a test and/or measurement system, in particular a vector network analyzer (VNA). The test and/or measurement system comprises: an RF signal source configured to generate an RF stimulus signal; a device port; a signal path which is arranged to electrically connect the RF signal source to the device port; and a measurement unit which is coupled to the signal path, wherein the measurement unit is adapted for measuring the RF stimulus signal propagating via the signal path to the device port and a measurement signal received at the device port, wherein the measurement unit is configured to generate measurement values representing the respective measurement results. The test and/or measurement system further comprises: a processing unit which is configured to receive the measurement values; and at least one bias tee which is coupled to the signal path; wherein the bias tee comprises a DC input port which is configured to receive a DC bias signal, wherein the bias tee is arranged to couple the received DC bias signal into the signal path. The test and/or measurement system is operable in a calibration mode during which at least four different calibration standards are alternately connected to the device port; wherein, for each connected calibration standard, the measurement unit is configured to measure the RF stimulus signal and the measurement signal; and wherein the test and/or measurement system is configured to couple the DC bias signal into the signal path via the bias tee during the connection of at least one of the calibration standards, but not during the connection of all of the calibration standards.

This achieves the advantage that the influence of a DC signal is taken into account during calibration of the system. In this way, a measurement of (active) DUTs with the calibrated system can be improved and measurement uncertainties can be reduced.

The measurement unit can be configured to measure the RF stimulus signal and the measurement signal independently from each other. For instance, the measurement unit can thereby measure an amplitude and/or phase of the RF stimulus signal and of the measurement signal.

The device port can be a test port and/or an RF port of the test and/or measurement system. For instance, the device port is a coaxial port. The device port can be suitable for connecting a DUT to be measured or characterized.

The DC bias signal can be a voltage and/or a current signal.

The radio frequency (RF) stimulus signal can be an AC and/or a CW signal in a radio frequency or a microwave range.

The measurement signal can be an RF signal or a signal which comprises RF signal components. For instance, the measurement signal can be an RF signal superimposed by a DC voltage and/or current signal (e.g., by the DC bias signal or a part thereof).

The processing unit can be configured to receive the measurement values in digital form from the measurement unit. Thereby, the processing unit and the measurement unit can be linked via a communication connection.

The processing unit can be a microprocessor, an FPGA or an ASIC.

In particular, the measurement values generated by the measurement unit represent or contain the results of the measurements of the RF stimulus signal and the measurement signal.

For instance, the measurement of the RF stimulus signal and the measurement signal with each connected calibration standard is a calibration measurement.

In an embodiment, in the calibration mode, the processing unit is configured to calculate error terms for the test and/or measurement system based on the measurement values received for each connected calibration standard.

In particular, the processing unit can be configured to calculate the error terms based on the measurements of the RF stimulus and the measurement signals measured with the at least four different calibration standards connected to the device port.

In an embodiment, the RF signal source is configured to sweep the RF stimulus signal over a predefined frequency range and/or a predefined power range; wherein the processing unit is configured to receive the measurement values for at least one, preferably for all, of the calibration standards for a plurality of frequencies and/or power levels within the respective range.

For instance, the test and/or measurement system is configured carry out measurements of the RF stimulus signal and the measurements signal for at least one, preferably for all, of the calibration standards with the plurality of frequencies and/or power levels of the RF stimulus signal.

In an embodiment, the test and/or measurement system is configured to change a level of the DC bias signal; wherein the processing unit is configured to receive the measurement values for at least one of the calibration standards for a plurality of DC bias signal levels.

Hereby, a level of the DC bias signal may correspond to a signal or power level of the DC bias signal (e.g., a voltage and/or current level). For instance, the test and/or measurement system is configured carry out measurements of the RF stimulus signal and the measurements signal with at least one calibration standard connected to the device port, while DC bias signals with at least two different (power) levels are alternately coupled into the signal path.

For each connected calibration standard, which is measured with an applied DC bias voltage, the processing unit can be configured to receive (from the measurement unit) a plurality of measurement values for different levels of the DC bias signal.

In an embodiment, the processing unit is configured to calculate a first set of error terms for a first level of the DC bias signal and at least a second set of error terms for at least a second level of the DC bias signal different to the first level.

In an embodiment, a device-under-test (DUT) is connectable to the device port; wherein the test and/or measurement system is operable in a measurement mode during which the test and/or measurement system is configured calculate scattering parameters (S-parameters) of the DUT, wherein the scattering parameters are corrected by a set of error terms which is selected based on a level of a DC signal which is applied to the DUT.

The test and/or measurement system can be configured to apply the DC signal to the DUT during the measurement mode (e.g., when conducting a measurement mode).

The measurement mode can be a "normal operating mode" of the test and/or measurement system.

The selected set of error terms can be one of the set of error terms which was calculated during calibration mode. Thereby, a set of error terms can be selected if it was calculated while applying a DC bias signal having a signal level which deviates from a signal level of the DC signal applied to the DUT by less than a threshold value.

In an embodiment, the bias tee is arranged between the RF signal source and the measurement unit, or the bias tee is arranged between the measurement unit and the device port.

In an embodiment, the test and/or measurement system comprises a DC signal generator which is configured to generate the DC bias signal with a determined voltage and/or current level; wherein the DC signal generator is arranged within a housing of the test and/or measurement system and is connected to the DC input port of the bias tee.

In an embodiment, the DC input port of the bias tee is connectable to an external DC signal generator which is arranged outside of a housing of the test and/or measurement system; wherein the test and/or measurement system is configured to control the external DC signal generator to generate the DC bias signal with a determined voltage and/or current level.

For instance, the test and/or measurement system (e.g., a central unit of the test and/or measurement system) is connected to the external DC signal generator via a data connection.

In an embodiment, the measurement unit comprises: a first directional coupler which is configured to forward at least a part of the RF stimulus signal from the signal path, a second directional coupler which is configured to forward at least a part of the measurement signal from the signal path, a first mixing stage configured to downconvert the part of the RF stimulus signal, and a second mixing stage which is configured to downconvert the part of the measurement signal.

In an embodiment, the measurement unit further comprises a digitization unit which is configured to simultaneously measure the downconverted part of the stimulus signal and the downconverted part of the measurement signal.

In an embodiment, the first directional coupler is configured to decouple the DC bias signal from the first mixing stage; and the second directional coupler is configured to decouple the DC bias signal from the second mixing stage.

In an embodiment, the test and/or measurement system comprises a first attenuator which is arranged between the first directional coupler and the first mixing stage; and a second attenuator which is arranged between the second directional coupler and the second mixing stage.

The first and/or the second attenuator can be variable attenuators.

In an embodiment, the second attenuator is configured to adapt its attenuation factor depending on a signal level of the measured downconverted measurement signal.

For instance, the processing unit can be configured to control the second variable attenuator to adapt its attenuation factor.

In an embodiment, the test and/or measurement system is configured to apply the DC bias signal to the DC input port of the bias tee if a calibration standard other than a short or an open calibration standard is attached to the device port.

This achieves the advantage that the DC bias signal can be applied to suitable broadband calibration standards, while a "standard" calibration without the DC bias signal can be carried out using calibration standards that are not suitable for applying such a bias signal, e.g. calibration standards which cannot suspend much dissipation power.

In an embodiment, the test and/or measurement system of any one of the preceding claims, further comprises: at least a further device port; at least a further signal path which is arranged to electrically connect the RF signal source to the further device port; and at least a further measurement unit which is coupled to the further signal path, wherein the further measurement unit is adapted for measuring the RF stimulus signal propagating via the further signal path to the further device port and a further measure measurement signal received at the further device port.

The further measurement unit can be configured to generate further measurement values representing the respective measurement results (of the RF stimulus signal and the further measurement signal), and the processing unit can be configured to receive the further measurement values from the measurement unit.

The RF stimulus signal propagating via the further signal path can be identical or different to the RF stimulus signal propagating via the signal path.

For instance, the test and/or measurement system can comprise 2, 4, 6, 8, 10 or more device ports.

In an embodiment, the DUT is connectable to the device port and to the further device port; wherein, in the measurement mode during, the test and/or measurement system is configured to calculate scattering parameters of the DUT connected to the device port and to the further device port, wherein the scattering parameters are corrected by a set of error terms which is selected based on a signal a level of a DC signal which is applied to the DUT.

In an embodiment, one of the calibration standards is a through calibration standard; wherein, in the calibration mode, the through calibration standard is connected to the device port and to the further device port, such that a through connection is established between the device port and the further device port; wherein the processing unit is configured to calculate error terms for the through connection.

In an embodiment, the test and/or measurement system further comprises at least one further bias tee which is coupled to the further signal path; wherein the further bias tee comprises a DC input port which is configured to receive a DC bias signal, wherein the further bias tee is arranged to couple the received DC bias signal into the further signal path.

The DC bias signal received at the DC input port of the further bias tee can be identical or different to a DC bias signal received at the DC input port of the bias tee.

According to a second aspect, the invention relates to a method for calibrating a test and/or measurement system, in particular a vector network analyzer. The method comprises: alternately connecting at least four different calibration standards to a device port of the test and/or measurement system; during the connection of each of the calibration standards: generating an RF stimulus signal, forwarding the RF stimulus signal to the device port via a signal path of the test and/or measurement system, measuring the RF stimulus signal propagating to the device port via the signal path and a measurement signal received at the device port, generating measurement values representing the respective measurement results of the RF stimulus signal and of the measurement signal, and, receiving the measurement values at a processing unit of the test and/or measurement system; wherein a DC bias signal is coupled into the signal path during the connection of at least one of the calibration standards, but not during the connection of all of the calibration standards.

The method can be carried out with the test and/or measurement system being set to a calibration mode.

In an embodiment, the method further comprises: calculating error terms for the test and/or measurement system based on the measurement values received for each connected calibration standard.

The above description with regard to the test and/or measurement system according to the first aspect of the invention is correspondingly valid for the method according to the second aspect of the invention.

The method according to the second aspect of the invention can be carried out with a test and/or measurement system, for example a VNA, according to the first aspect of the invention.

BRIEF DESCRIPTION OF THE DRAWINGS

The invention will be explained in the following together with the figures.

DETAILED DESCRIPTION OF THE PREFERRED EMBODIMENTS

Figure 1:
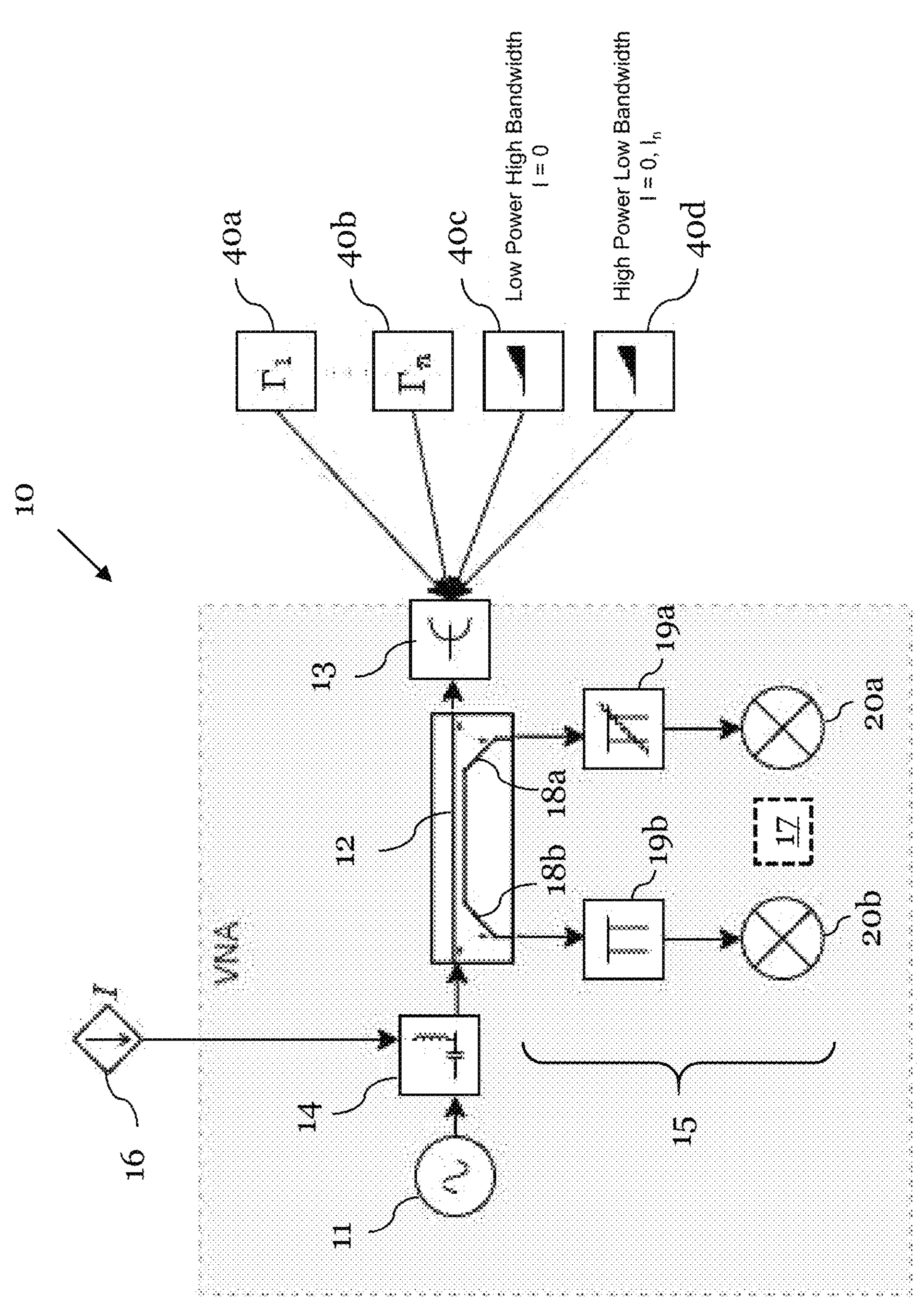
FIG. 1 shows a schematic diagram of a test and/or measurement system according to an embodiment.

FIG. 1 shows a schematic diagram of a test and/or measurement system 10 according to an embodiment.

The test and/or measurement system 10 comprises an RF signal source 11 configured to generate an RF stimulus signal; a device port 13; and a signal path 12 which is arranged to electrically connect the RF signal source 11 to the device port 13.

The test and/or measurement system 10 further comprises a measurement unit 15 which is coupled to the signal path 12, wherein the measurement unit 15 is adapted for measuring the RF stimulus signal propagating via the signal path 12 to the device port 13 and a measurement signal received at the device port 13, wherein the measurement unit 15 is configured to generate measurement values representing the respective measurement results. The test and/or measurement system 10 further comprises a processing unit (not shown in FIG. 1) which is configured to receive the measurement values; and at least one bias tee 14 which is coupled to the signal path 12; wherein the bias tee 14 comprises a DC input port which is configured to receive a DC bias signal, wherein the bias tee 14 is arranged to couple the received DC bias signal into the signal path 12;

The test and/or measurement system 10 is operable in a calibration mode during which at least four different calibration standards 40*a-d* are alternately connected to the device port 13; wherein, for each connected calibration standard 40*a-d*, the measurement unit 15 is configured to measure the RF stimulus signal and the measurement signal; and wherein the test and/or measurement system 10 is configured to couple the DC bias signal into the signal path 12 via the bias tee 15 during the connection of at least one of the calibration standards 40*a-d*, but not during the connection of all of the calibration standards 40*a-d*.

The test and/or measurement system 10 can be a vector network analyzer.

The measurement unit 15 can be configured to measure the RF stimulus signal propagating (or traveling) from the RF signal source 11 towards the device port 13, and to measure the measurement signal propagating (or traveling) via the signal path 12 from the device port 13 in the direction of the RF signal source 11.

The DC bias signal can be a DC voltage and/or current signal.

The radio frequency (RF) stimulus signal can be an AC and/or a CW signal in a radio frequency or a microwave range.

The measurement signal can be an RF signal or an RF signal superimposed by a DC voltage and/or current signal.

The measurement signal, which is measured in calibration mode, can be received in response to the RF stimulus signal and/or the DC bias signal. For instance, the measurement signal can comprise a reflection of the RF stimulus signal and/or of the DC bias signal from a connected calibration standard.

The signal path 12 can comprise an electrical line which connects the RF signal source 11 with the device port 13. The signal path 12 can be a measurement path.

The device port 13 can be a test port and/or an RF port of the test and/or measurement system 10. The device port 13 can be configured to be connected to a DUT and/or to different calibration standards.

Preferably, the coupling of the measurement unit to the signal path is not a galvanic coupling. This can prevent that additional (unwanted) power is distributed into the measurement unit.

The measurement unit can be configured to measure the RF stimulus signal and the measurement signal independently from each other.

For instance, the measurement unit 15 can be configured to measure an amplitude and/or phase of the RF stimulus signal and of the measurement signal. The measurement unit 15 can therefore comprise an amplitude and/or phase sensor configured to measure the amplitude and/or phase of the RF stimulus and the measurement signal. Furthermore, the measurement unit 15 can be configured to measure a relative phase difference between the RF stimulus signal and the measurement signal.

The processing unit can be configured to receive the measurement values from the measurement unit in digital form.

The measurement values can represent or contain the measurement results of the measurement unit, i.e., the measured RF stimulus signal and measurement signal.

In the calibration mode, the processing unit can be configured to calculate error terms of the test and/or measurement system 10 based on the results of the calibration measurements, e.g. based on the measurement values received from the measurement unit 15 for each connected calibration standard.

The error terms can comprise correction values which can be applied mathematically to measurement values of the test and/or measurement system 10, to correct for measurement inaccuracies.

For instance, the processing unit can calculate the error terms by comparing the (known) properties of the calibration standards to the measured quantities (e.g., the amplitude and/or phase of the RF signal and the measurement signals, and/or the phase difference between these signals) and applying an error model. For instance, the error model is a mathematical model which receives the properties of the calibration standards, the measured quantities and/or the DC signal level(s) as input parameters and which calculates the error terms using said parameters.

The error terms can be stored in a memory of the test and/or measurement system 10.

The test and/or measurement system 10, in particular the RF signal source 11, can be configured to sweep the RF stimulus signal over a determined frequency and/or power range. This sweep can be carried out during the connection of at least one, preferably during the connection of all, of the calibration standards. The processing unit can be configured to receive the measurement results (i.e., respective measurement values) for the respective calibration standards for a plurality of frequencies and/or power levels of the RF stimulus signal within the frequency and/or power range The at least four different calibration standards 40*a-d* can be stand-alone calibration standards, or at least some or all of the calibration standards 40*a-d* can be combined in a common housing with one connection port (e.g., a calibration unit). In case of several calibration standards combined in a common calibration unit, a data connection to the calibration unit can be used to select a respective calibration standard.

The calibration standards 40*a-b* can comprise any one of the following calibration standards: open, short, match and through.

For example, at least one calibration standard 40*b* is configured for a calibration with a low power high bandwidth signal (e.g., the RF stimulus signal swept over wide freq. range without the DC bias signal applied, I=0). At least a further calibration standard 40*d* is configured for a calibration with a high power low bandwidth signal. For instance, when the further calibration standard 40*d* is connected, respective calibration measurements can be carried out with the DC bias signal ($I=I_n$) and without the DC bias signal (I=0) being coupled into the signal path.

Thus, the further calibration standard(s) 40*d*, which can be added to the calibration routine, can focus on higher power handling capabilities with lower bandwidth. For instance, these standards are measured with an applied dc current signal $I_n$. By comparing the error terms of I=0 and $I=I_n$, a resulting set of error terms can be corrected within the lower bandwidth of these "high power" calibration standards 40*d*.

For instance, the test and/or measurement system 10 can be configured to apply the DC bias signal to the DC input port of the bias tee (and thus, to the signal path 12) if a calibration standard other than short and open is attached to the device port.

The test and/or measurement system 10 can comprise a DC signal generator 16 which is configured to generate the DC bias signal with a specific (determined) voltage and/or current level.

The DC signal generator 16 can be arranged within a housing of the test and/or measurement system, and can be connected to the DC input port of the bias tee 14.

Alternatively, the DC signal generator 16 can be an external device (i.e., external to a housing of the test and/or measurement system 10), wherein the test and/or measurement system 10 (e.g., the processing unit) can be configured to control the DC signal generator 16 such that the DC signal generator 16 generates and outputs the DC bias signal with a specific voltage and/or current level. For instance, the DC signal generator 16 can be controlled by the test and/or measurement system 10 via USB or other suitable data connection means. The DC bias signal generated by the DC signal generator 16 can be fed via a coaxial cable to the components in the housing of the test and/or measurement system 10, in particular to the DC input port of the bias tee 14.

The test and/or measurement system 10 (in particular DC signal generator 16) can be configured to change a level of the DC bias signal. The processing unit can be configured to receive the measurement values for the respective calibration standards 40*a-d* (which are suitable for DC-biasing) for at least two different power levels of the DC signal.

Thereby, for instance, the DC bias signal is kept constant during a frequency sweep of the RF stimulus signal. After the frequency sweep, the power level of the DC bias signal can be changed. Then, a further frequency sweep can be carried out.

The processing unit can be configured to calculate a first set of error terms for a first level of the DC bias signal and at least a second set of error terms for at least a second level of the DC bias signal different to the first level.

The bias tee 14 can comprise the DC input port (e.g., a low frequency port) for receiving the DC bias signal, an RF input port (e.g., a high frequency port) for receiving the RF stimulus signal and a third port which is connected to the signal path. The bias tee 14 can be type of diplexer which multiplexes the RF input port and the DC input port onto the third port.

For instance, the bias tee 14 further comprises a capacitor with is connected to the RF input port and an inductor which is connected to the DC input port. The capacitor can be configured to transmit the RF stimulus signal and block the DC bias signal, and the inductor can be configured to transmit the DC bias signal and block the RF stimulus signal.

The bias tee 14 can be arranged with in the signal path 12. For instance, the bias tee 14 is arranged between the RF signal source 11 and the measurement unit 15. Alternatively, the bias tee 14 can be arranged between the measurement unit 15 and the device port 13.

As shown in FIG. 1, the measurement unit 15 may comprise a first directional coupler 18*a* which is configured to receive at least a part of the RF stimulus signal from the signal path 12, and a second directional coupler 18*b* which is configured to receive at least a part of the measurement signal from the signal path 12. Furthermore, the measurement unit 15 may comprise a first mixing stage 20*a* configured to downconvert the RF stimulus signal and a second mixing stage 20*b* configured to downconvert the measurement signal. Each mixing stage 20*a*, 20*b* can therefore comprise a mixer which can receive the RF stimulus signal respectively a part of the measurement signal and an LO (local oscillator) signal.

The directional couplers 18*a*, 18*b* can be directly or indirectly connected to the respective mixing stages 20*a*, 20*b* and can be configured to forward the received RF stimulus signal respectively measurement signal to the respective mixing stage 20*a*, 20*b*.

The mixing stages 20*a*, 20*b* can be configured to downconvert the RF stimulus signal and the measurement signal to an intermediate (IF) frequency, e.g. for further processing.

The measurement unit 15 can further comprise a digitization unit 17 which can be configured to simultaneously measure the downconverted part of the stimulus signal and the downconverted part of the measurement signal. For instance, the digitization unit 17 may comprise an analog-to-digital (ADC) converter.

The measurement unit 15 can be configured to forward the, thus, digitalized signals to the processing unit.

The first directional coupler 18*a* can be configured to decouple the DC bias signal from the first mixing stage 20*a*, and the second directional coupler 18*b* can be configured to decouple the DC bias signal (or a reflection thereof) from the second mixing stage 20*b*. In other words, the directional couplers 18*a*, 18*b* can be configured to only the RF stimulus signal and/or only the RF signal components of the measurement signal to the mixing stages 20*a*, 20*b*.

The test and/or measurement system 10, in particular the measurement unit 15, can comprise a first attenuator 19*a* which is arranged between the first directional coupler 18*a* and the first mixing stage 20*a*, and a second attenuator 19*b* which is arranged between the second directional coupler 18*b* and the second mixing stage 20*b*.

The first and/or the second attenuator 19*a*, 19*b* can be variable attenuators. By means of these attenuators 19*a*, 19*b*, the dynamic range of the measurement unit 15 can be increase, e.g. when measuring a DUT.

In particular, the second attenuator 19*b*, which is arranged in a path that is used to receive the measurement signal, is a variable attenuator. For instance, if the DUT is an amplifier, an amplified signal received from the DUT is fed into the device port 13 and decoupled through the second directional coupler 18*b*. By changing an attenuation level of this attenuator 19*b*, the dynamic range can be extended (e.g., to measure an amplified response signal from the amplifier).

For instance, the second attenuator 19*b* can be configured to adapt its attenuation factor depending on a signal level of the measured downconverted measurement signal. In an example, the second attenuator can be controlled by the processing unit to adapt its attenuation factor.

The attenuation factor of first and/or second attenuator 19*a*, 19*b* can thereby be increased until the digitalization unit, e.g. an A/D converted, reaches its upper limits.

Figure 2:
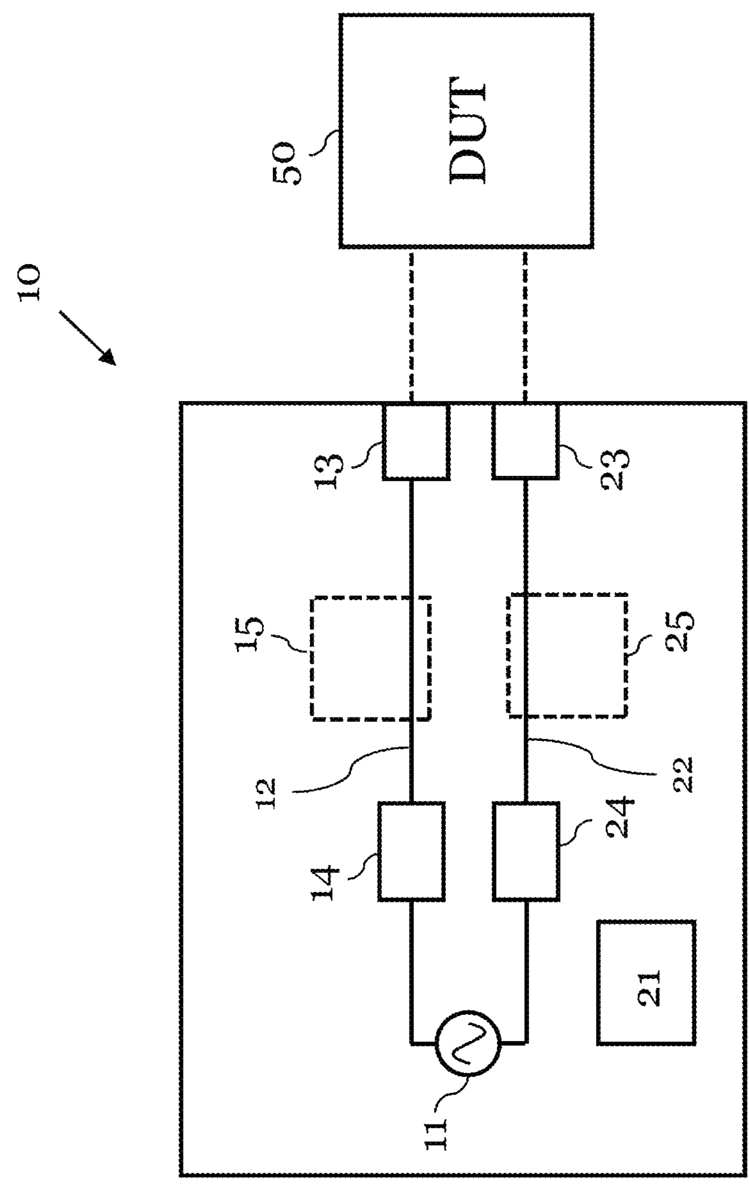
FIG. 2 shows a schematic diagram of a test and/or measurement system according to an embodiment.

FIG. 2 shows a schematic diagram of the test and/or measurement system 10 according to an embodiment. Thereby, a DUT 50 is connected to the device port 13 of the test and/or measurement system 10.

The test and/or measurement system 10 can be operable in a measurement mode (or normal operation mode) during which the system 10, in particular the processing unit 21, is configured calculate scattering parameters (S-parameters) of the DUT 50.

The DUT 50 can be an RF device under test. For example, the DUT 50 is an active device (e.g., a communication device) or a passive device (e.g., a cable or a filter).

The processing unit can be a (micro) processor, an FPGA or an ASIC.

As shown in FIG. 2, the test and/or measurement system 10 can comprise at least one further device port 23 and at least one further signal path 22, wherein the RF signal source 11 is connectable through the second signal path 22 to the further device port 23.

Applying a DC signal, e.g. a DC voltage, to the device ports (so-called biasing) is often necessary for measuring the DUT.

The DC signal applied to the DUT can be generated by the same DC signal generator 16 which generates the DC bias signal during calibration. The DC signal can be a DC measurement signal. The DC signal can be a voltage and/or current signal.

The test and/or measurement system 10 may comprise at least one further measurement unit 25, which is coupled to the further measurement path 22. The further measurement unit 25 can be configured to measure the RF stimulus signal propagating from the RF signal source 11 to the further device port 23, preferably independently from a measurement signal received at the further device port 23 (i.e., propagating from the further device port 23 towards the RF signal source 11. The further measurement unit 25 can output respective further measurement values based on said measurements, e.g. to the processing unit 21.

For instance, the RF signal source 11 can be either coupled to the device port 13 or to the further device port 23, but not to all device ports 13, 23 at the same time.

The test and/or measurement system 10 may further comprise at least one further bias tee 24 which is coupled to the further signal path 22. For instance, the second bias tee 24 can be arranged within the further signal path 22. In calibration mode, the further bias tee 24 can be configured to receive a DC bias signal (or a further DC bias signal) and to couple the DC signal into the further signal path 22.

For example, one of the calibration standards 40*a-d* shown in FIG. 1 can be a through calibration standard which can connected to the device port 13 and to the further device port 23, in calibration mode. In this way, a through connection can be established between the device port 13 and the further device port 23. In this case, the processing unit can be configured to calculate error terms for the through connection.

When the system 10 operates in measurement mode, the DUT 50 can be connectable to the device port 13 and to the further device port 23, as shown in FIG. 2. The test and/or measurement system 10 can be configured to calculate S-parameters of the thus connected DUT 50, wherein the S-parameters (or measurement values used to calculate the S-parameters) can be corrected by the set of error terms (determined during calibration mode) which can be selected based on the level of the DC signal applied to the DUT in measurement mode. For instance, the set of error terms can be selected if they were calculated while applying a DC bias signal with deviates by less than a threshold from the DC signal applied to the DUT 50

Figure 3:
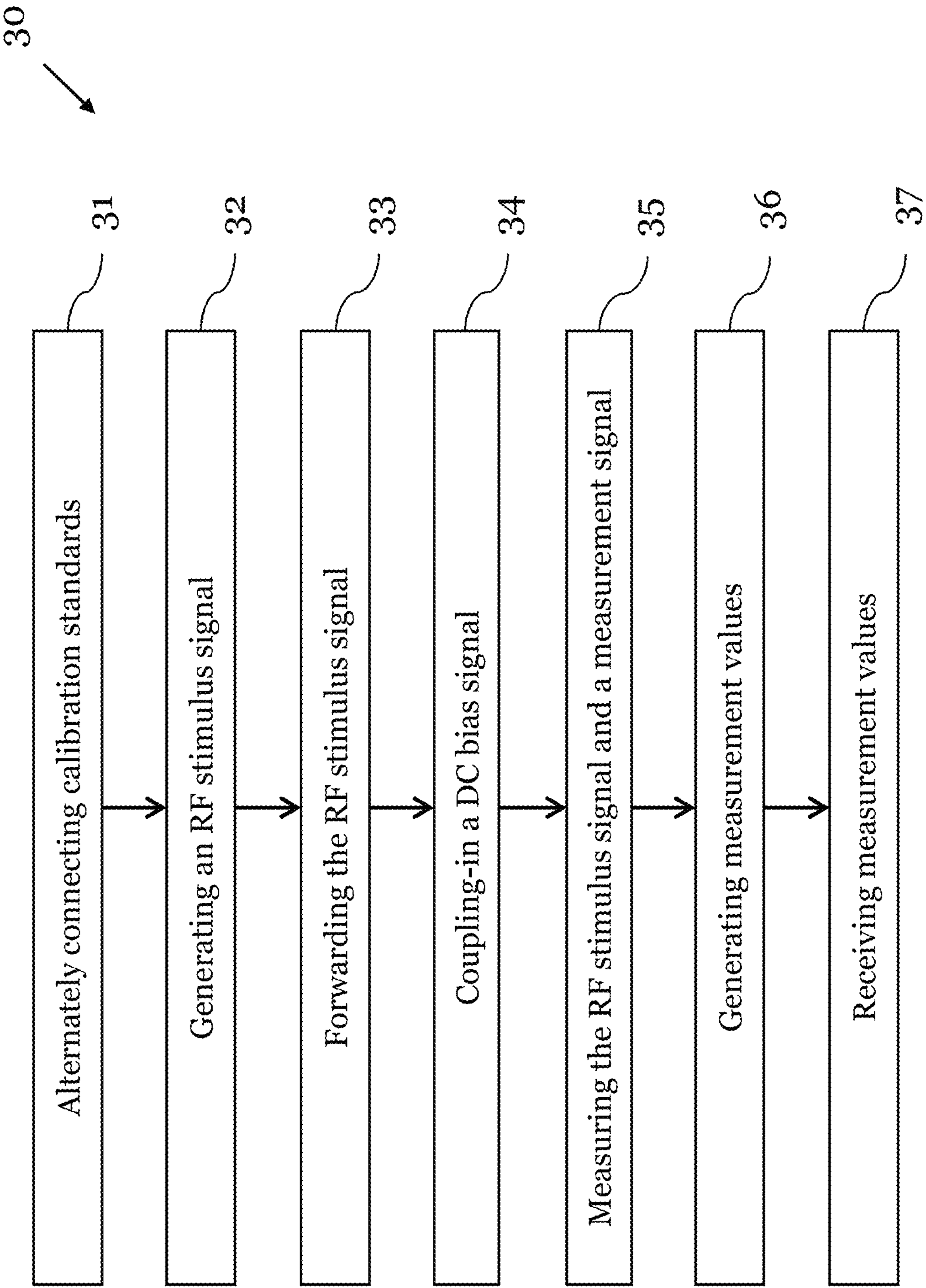
FIG. 3 shows a flow chart of a method for calibrating a test and/or measurement system.

FIG. 3 shows a flow chart of a method 30 for calibrating a test and/or measurement system 10. For instance, the method 30 can be used to calibrate the test and/or measurement system 10 as shown in FIG. 1 or 2.

The method 30 comprises the steps of: alternately connecting 31 at least four different calibration standards to a device port of the test and/or measurement system; and during the connection of each of the calibration standards: generating 32 an RF stimulus signal, forwarding 33 the RF stimulus signal to the device port via a signal path of the test and/or measurement system, measuring 35 the RF stimulus signal propagating to the device port via the signal path and a measurement signal received at the device port, generating 36 measurement values representing the respective measurement results of the RF stimulus signal and of the measurement signal, and receiving 37 the measurement values at a processing unit of the test and/or measurement system; wherein a DC bias signal is coupled 34 into the signal path during the connection of at least one of the calibration standards, but not during the connection of all of the calibration standards.

For instance, the method 30 can be carried out when the test and/or measurement system 10 is set to a calibration mode.

The method 30 may comprise the further step of: calculating error terms for the test and/or measurement system 10 based on the measurement values received for each connected calibration standard 40*a-d*.

All features described above or features shown in the figures can be combined with each other in any advantageous manner within the scope of the invention.

The invention claimed is:

1. A test and/or measurement system comprising:

an RF signal source configured to generate an RF stimulus signal;

a device port;

a signal path which is arranged to electrically connect the RF signal source to the device port;

a measurement unit which is coupled to the signal path, wherein the measurement unit is adapted for measuring the RF stimulus signal propagating via the signal path to the device port and a measurement signal received at the device port, wherein the measurement unit is configured to generate measurement values representing the respective measurement results;

a processing unit which is configured to receive the measurement values; and at least one bias tee which is coupled to the signal path, wherein the bias tee comprises a DC input port which is configured to receive a DC bias signal, wherein the bias tee is arranged to couple the received DC bias signal into the signal path;

wherein the test and/or measurement system is operable in a calibration mode during which at least four different calibration standards are alternately connected to the device port;

wherein, for each connected calibration standard, the measurement unit is configured to measure the RF stimulus signal and the measurement signal;

wherein the test and/or measurement system is configured to couple the DC bias signal into the signal path via the bias tee during the connection of at least one of the calibration standards, but not during the connection of all of the calibration standards; and wherein the measurement unit comprises:

a first directional coupler which is configured to forward at least a part of the RF stimulus signal from the signal path, a second directional coupler which is configured to forward at least a part of the measurement signal from the signal path, a first mixing stage which is configured to downconvert the part of the RF stimulus signal, and a second mixing stage which is configured to downconvert the part of the measurement signal.

2. The test and/or measurement system of claim 1, wherein, in the calibration mode, the processing unit is configured to calculate error terms for the test and/or measurement system based on the measurement values received for each connected calibration standard.

3. The test and/or measurement system of claim 1, wherein the RF signal source is configured to sweep the RF stimulus signal over a predefined frequency range and/or a predefined power range;

wherein the processing unit is configured to receive the measurement values for at least one of the calibration standards for a plurality of frequencies and/or power levels within the respective range.

4. The test and/or measurement system of claim 1, wherein the test and/or measurement system is configured to change a level of the DC bias signal;

wherein the processing unit is configured to receive the measurement values for at least one of the calibration standards for a plurality of DC bias signal levels.

5. The test and/or measurement system of claim 2, wherein the processing unit is configured to calculate a first set of error terms for a first level of the DC bias signal and at least a second set of error terms for at least a second level of the DC bias signal different to the first level.

6. The test and/or measurement system of claim 5, wherein a device-under-test, DUT, is connectable to the device port;

wherein the test and/or measurement system is operable in a measurement mode during which the test and/or measurement system is configured to calculate scattering parameters of the DUT, wherein the scattering parameters are corrected by a set of error terms which is selected based on a level of a DC signal which is applied to the DUT.

7. The test and/or measurement system of claim 1, wherein the bias tee is arranged between the RF signal source and the measurement unit, or wherein the bias tee is arranged between the measurement unit and the device port.

8. The test and/or measurement system of claim 1, further comprising:

a DC signal generator which is configured to generate the DC bias signal with a determined voltage and/or current level;

wherein the DC signal generator is arranged within a housing of the test and/or measurement system and is connected to the DC input port of the bias tee.

9. The test and/or measurement system of claim 1, wherein the DC input port of the bias tee is connectable to an external DC signal generator which is arranged outside of a housing of the test and/or measurement system;

wherein the test and/or measurement system is configured to control the external DC signal generator to generate the DC bias signal with a determined voltage and/or current level.

10. The test and/or measurement system of claim 1, wherein the measurement unit further comprises a digitization unit which is configured to simultaneously measure the downconverted part of the stimulus signal and the downconverted part of the measurement signal.

11. The test and/or measurement system of claim 1, wherein the first directional coupler is configured to decouple the DC bias signal from the first mixing stage; and wherein the second directional coupler is configured to decouple the DC bias signal from the second mixing stage.

12. The test and/or measurement system of claim 1, further comprising:

a first attenuator which is arranged between the first directional coupler and the first mixing stage; and a second attenuator which is arranged between the second directional coupler and the second mixing stage.

13. The test and/or measurement system of claim 12, wherein the second attenuator is configured to adapt its attenuation factor depending on a signal level of the measured downconverted measurement signal.

14. The test and/or measurement system of claim 1, wherein the test and/or measurement system is configured to apply the DC bias signal to the DC input port of the bias tee if a calibration standard other than a short or an open calibration standard is attached to the device port.

15. The test and/or measurement system of claim 1, further comprising:

at least a further device port;

at least a further signal path which is arranged to electrically connect the RF signal source to the further device port; and at least a further measurement unit which is coupled to the further signal path, wherein the further measurement unit is adapted for measuring the RF stimulus signal propagating via the further signal path to the further device port and a further measure measurement signal received at the further device port.

16. The test and/or measurement system of claim 6, wherein the DUT is connectable to the device port and to a further device port;

wherein, in the measurement mode during, the test and/or measurement system is configured to calculate scattering parameters of the DUT connected to the device port and to the further device port, wherein the scattering parameters are corrected by a set of error terms which is selected based on a signal a level of a DC signal which is applied to the DUT.

17. The test and/or measurement system of claim 15, wherein one of the calibration standards is a through calibration standard;

wherein, in the calibration mode, the through calibration standard is connected to the device port and to the further device port, such that a through connection is established between the device port and the further device port;

wherein the processing unit is configured to calculate error terms for the through connection.

18. The test and/or measurement system of claim 15, further comprising:

at least one further bias tee which is coupled to the further signal path; wherein the further bias tee comprises a DC input port which is configured to receive a DC bias signal, wherein the further bias tee is arranged to couple the received DC bias signal into the further signal path.

19. A method for calibrating a test and/or measurement system comprising:

alternately connecting at least four different calibration standards to a device port of the test and/or measurement system;

during the connection of each of the calibration standards:

-generating an RF stimulus signal, forwarding the RF stimulus signal to the device port via a signal path of the test and/or measurement system, measuring the RF stimulus signal propagating to the device port via the signal path and a measurement signal received at the device port, generating measurement values representing the respective measurement results of the RF stimulus signal and of the measurement signal, and receiving the measurement values at a processing unit of the test and/or measurement system;

wherein measuring comprises:

forwarding at least a part of the RF stimulus signal from the signal path, forwarding at least a part of the measurement signal from the signal path, downconverting the forwarded part of the RF stimulus signal, and downconverting the forwarded part of the measurement signal;

wherein a DC bias signal is coupled into the signal path during the connection of at least one of the calibration standards, but not during the connection of all of the calibration standards.

20. A test and/or measurement system comprising:

an RF signal source configured to generate an RF stimulus signal;

a device port;

a signal path which is arranged to electrically connect the RF signal source to the device port;

a measurement unit which is coupled to the signal path, wherein the measurement unit is adapted for measuring the RF stimulus signal propagating via the signal path to the device port and a measurement signal received at the device port, wherein the measurement unit is configured to generate measurement values representing the respective measurement results;

a processing unit which is configured to receive the measurement values; and at least one bias tee which is coupled to the signal path, wherein the bias tee comprises a DC input port which is configured to receive a DC bias signal, wherein the bias tee is arranged to couple the received DC bias signal into the signal path;

wherein the test and/or measurement system is operable in a calibration mode during which at least four different calibration standards are alternately connected to the device port;

wherein, for each connected calibration standard, the measurement unit is configured to measure the RF stimulus signal and the measurement signal;

wherein the test and/or measurement system is configured to couple the DC bias signal into the signal path via the bias tee during the connection of at least one of the calibration standards, but not during the connection of all of the calibration standards;

and further comprising:

at least a further device port;

at least a further signal path which is arranged to electrically connect the RF signal source to the further device port; and at least a further measurement unit which is coupled to the further signal path, wherein the further measurement unit is adapted for measuring the RF stimulus signal propagating via the further signal path to the further device port and a further measure measurement signal received at the further device port.

* * * * *